US012610453B2

(12) United States Patent
Li et al.

(10) Patent No.: US 12,610,453 B2
(45) Date of Patent: Apr. 21, 2026

(54) VERTICAL POWER SUPPLY SYSTEM AND MANUFACTURING METHOD OF CONNECTION BOARD

(71) Applicant: Delta Electronics (Shanghai) CO., LTD, Shanghai (CN)

(72) Inventors: Hui Li, Shanghai (CN); Le Liang, Shanghai (CN); Wulong Cong, Shanghai (CN)

(73) Assignee: Delta Electronics (Shanghai) CO., LTD., Shanghai (CN)

( * ) Notice: Subject to any disclaimer, the term of this patent is extended or adjusted under 35 U.S.C. 154(b) by 0 days.

(21) Appl. No.: 18/354,689

(22) Filed: Jul. 19, 2023

(65) Prior Publication Data

US 2023/0363084 A1 Nov. 9, 2023

Related U.S. Application Data

(63) Continuation-in-part of application No. 17/656,432, filed on Mar. 25, 2022, now Pat. No. 11,812,545, (Continued)

(30) Foreign Application Priority Data

Jan. 8, 2020 (CN) .......................... 202010016898.7
Oct. 18, 2021 (CN) .......................... 202111210246.8
(Continued)

(51) Int. Cl.
*G06F 1/26* (2006.01)
*H05K 1/02* (2006.01)
(Continued)

(52) U.S. Cl.
CPC ............. *H05K 1/0231* (2013.01); *G06F 1/26* (2013.01); *H05K 1/115* (2013.01); *H05K 1/144* (2013.01);
(Continued)

(58) Field of Classification Search
CPC ............ G06F 1/26; G06F 1/32; G06F 1/3203; H05K 1/0231; H05K 1/11; H05K 1/14;
(Continued)

(56) References Cited

U.S. PATENT DOCUMENTS 5,798,567 A 8/1998 Kelly et al.
6,225,702 B1 5/2001 Nakamura
(Continued)

FOREIGN PATENT DOCUMENTS

CA 2647863 A1 7/2009
CN 1493180 A 4/2004
(Continued)

OTHER PUBLICATIONS

2nd Office Action dated Apr. 25, 2024 for Chinese Application No. 202010016898.7.
(Continued)

*Primary Examiner* — Levi Gannon
(74) *Attorney, Agent, or Firm* — Qinghong Xu

(57) ABSTRACT

A vertical power supply system and a manufacturing method of a connection board are provided. The vertical power supply system includes a system board, a substrate, a chip unit, a plurality of first capacitors, a plurality of second capacitors, a plurality of conductive portions and a power unit. The system board includes a first surface and a second surface which are opposite to each other. The substrate includes a third surface and a fourth surface which are opposite to each other, and the third surface is located between the fourth surface and the second surface. The chip unit is disposed on the first surface. The first capacitors are disposed on the second surface. The second capacitors are disposed on the third surface. The third surface and the
(Continued)

1 second surface are electrically connected through the conductive portions. The power unit is disposed on the fourth surface.

13 Claims, 21 Drawing Sheets

Related U.S. Application Data which is a continuation-in-part of application No. 17/108,040, filed on Dec. 1, 2020, now Pat. No. 11,320,879.

(30) Foreign Application Priority Data

| | | |
|---|---|---|
| Dec. 28, 2021 | (CN) .......................... | 202111626437.2 |
| Jul. 7, 2023 | (CN) .......................... | 202310835955.8 |

(51) Int. Cl.

| | |
|---|---|
| *H05K 1/11* | (2006.01) |
| *H05K 1/14* | (2006.01) |
| *H05K 1/18* | (2006.01) |
| *H05K 1/181* | (2026.01) |
| *H05K 3/24* | (2006.01) |
| *H05K 7/02* | (2006.01) |

(52) U.S. Cl.
CPC ............. *H05K 1/145* (2013.01); *H05K 1/181* (2013.01); *H05K 3/243* (2013.01); *H05K 7/023* (2013.01); *H05K 2201/042* (2013.01); *H05K 2201/10015* (2013.01); *H05K 2201/10734* (2013.01)

(58) Field of Classification Search
CPC ........ H05K 1/141; H05K 1/144; H05K 1/145; H05K 1/162; H05K 1/181; H05K 7/023
See application file for complete search history.

(56) References Cited

U.S. PATENT DOCUMENTS

| | | | |
|---|---|---|---|
| 6,346,679 B1 | 2/2002 | Nakamura | |
| 6,362,986 B1 | 3/2002 | Schultz et al. | |
| 6,479,758 B1 | 11/2002 | Arima et al. | |
| 6,740,965 B2 | 5/2004 | Hsu et al. | |
| 7,449,799 B2 | 11/2008 | Levin et al. | |
| 8,395,404 B2 | 3/2013 | Kaku | |
| 10,395,819 B2 | 8/2019 | Wukovits et al. | |
| 11,145,632 B2 | 10/2021 | Dominguez et al. | |
| 2004/0027813 A1* | 2/2004 | Li ........................ | H05K 1/0231 |
| | | | 257/E23.079 |
| 2004/0124511 A1* | 7/2004 | Li ........................ | H05K 1/0212 |
| | | | 257/678 |
| 2005/0169033 A1 | 8/2005 | Sugita et al. | |
| 2005/0274982 A1 | 12/2005 | Ueda et al. | |
| 2006/0181857 A1 | 8/2006 | Belady et al. | |
| 2007/0045815 A1 | 3/2007 | Urashima et al. | |
| 2007/0188997 A1 | 8/2007 | Hockanson et al. | |
| 2007/0230150 A1 | 10/2007 | Castriotta et al. | |
| 2007/0278660 A1 | 12/2007 | Han et al. | |
| 2009/0290316 A1 | 11/2009 | Kariya | |
| 2009/0296360 A1 | 12/2009 | Doblar et al. | |
| 2010/0258952 A1 | 10/2010 | Fjelstad | |
| 2011/0080717 A1 | 4/2011 | Koide et al. | |
| 2011/0316119 A1 | 12/2011 | Kim et al. | |
| 2014/0133115 A1 | 5/2014 | Iguchi | |
| 2014/0334121 A1 | 11/2014 | Ito et al. | |
| 2015/0054611 A1 | 2/2015 | Cambronero Garcia | |
| 2015/0117862 A1 | 4/2015 | Trotta et al. | |
| 2016/0300659 A1 | 10/2016 | Zhang et al. | |
| 2016/0379952 A1 | 12/2016 | Cahill et al. | |
| 2017/0048963 A1 | 2/2017 | Murakami | |

| | | |
|---|---|---|
| 2017/0069607 A1 | 3/2017 | Yap |
| 2018/0032117 A1 | 2/2018 | Leigh et al. |
| 2018/0076718 A1 | 3/2018 | Zeng et al. |
| 2019/0074771 A1 | 3/2019 | Zeng et al. |
| 2019/0198462 A1 | 6/2019 | Nakagawa et al. |
| 2019/0254166 A1 | 8/2019 | Ji et al. |
| 2019/0320554 A1 | 10/2019 | Nakajima et al. |
| 2020/0211977 A1 | 7/2020 | Kim et al. |
| 2020/0221582 A1 | 7/2020 | Hong et al. |
| 2020/0260586 A1 | 8/2020 | Hong et al. |
| 2021/0280354 A1 | 9/2021 | Xiong et al. |
| 2022/0217836 A1 | 7/2022 | Hong et al. |

FOREIGN PATENT DOCUMENTS

| | | |
|---|---|---|
| CN | 101211792 A | 7/2008 |
| CN | 101996979 A | 3/2011 |
| CN | 103730434 A | 4/2014 |
| CN | 103871716 A | 6/2014 |
| CN | 104112727 A | 10/2014 |
| CN | 102576593 B | 12/2014 |
| CN | 104576583 A | 4/2015 |
| CN | 105449987 A | 3/2016 |
| CN | 102648667 B | 9/2016 |
| CN | 106329930 A | 1/2017 |
| CN | 107026575 A | 8/2017 |
| CN | 107154385 A | 9/2017 |
| CN | 206726916 U | 12/2017 |
| CN | 107545974 A | 1/2018 |
| CN | 107799511 A | 3/2018 |
| CN | 108140616 A | 6/2018 |
| CN | 108962556 A | 12/2018 |
| CN | 109075706 A | 12/2018 |
| CN | 110112905 A | 8/2019 |
| CN | 111312704 A | 6/2020 |
| CN | 111313655 A | 6/2020 |
| CN | 212086589 U | 12/2020 |
| CN | 112788842 A | 5/2021 |
| CN | 113098234 A | 7/2021 |
| CN | 113557605 A | 10/2021 |
| IN | 201914054517 A | 12/2019 |
| IN | 202014000536 A | 1/2020 |
| JP | H097862 A | 1/1997 |
| JP | 2019079943 A | 5/2019 |
| WO | 2020210932 A1 | 10/2020 |

OTHER PUBLICATIONS

The 1st office action dated Jan. 24, 2022 for CN patent application No. 202010018822.8.

The 1st Office Action dated Dec. 31, 2021 for CN patent application No. 202010018831.7.

The 1st Office Action dated Dec. 16, 2021 for IN patent application No. 202014054043.

The 1st Office Action dated Sep. 23, 2021 for IN patent application No. 202034053622.

The Non-Final OA dated May 10, 2021 for U.S. Appl. No. 17/108,040.

The Non-Final OA dated Jul. 11, 2022 of U.S. Appl. No. 17/102,393.

1st Office Action dated Aug. 29, 2023 of Chinese Application No. 202010016898.7.

Non-Final Office Action dated Nov. 24, 2023 of U.S. Appl. No. 17/105,650.

English translation of JP2012124977 (Year: 2012).

Non-Final OA dated Nov. 22, 2024 of U.S. Appl. No. 18/354,684.

Notice of Allowance dated Sep. 1, 2025 of Chinese Application No. 2023102947005.

Non-Final Rejection dated Feb. 6, 2023 of U.S. Appl. No. 17/656,432.

Notice of Allowance dated Aug. 28, 2024 of U.S. Appl. No. 18/531,711.

Notice of Allowance dated Sep. 12, 2023 of U.S. Appl. No. 18/171,686.

1st Office Action dated Mar. 3, 2026 of Chinese Application No. 202111626437.2.

\* cited by examiner

VERTICAL POWER SUPPLY SYSTEM AND MANUFACTURING METHOD OF CONNECTION BOARD

CROSS-REFERENCE TO RELATED APPLICATIONS

This application is a continuation-in-part application of U.S. Application Ser. No. 17/656,432 filed on Mar. 25, 2022, which is a continuation-in-part application of U.S. Application Ser. No. 17/108,040 filed on Dec. 1, 2020 and issued as U.S. Pat. No. 11,320,879, which is based upon and claims priority to Chinese Patent Application No. 2020100168987, filed on Jan. 8, 2020, and further claims priority to Chinese Patent Application No. 2021112102468, filed on Oct. 18, 2021 and Chinese Patent Application No. 2021116264372, filed on Dec. 28, 2021. This application also claims priority to China Patent Application No. 2023108359558 filed on Jul. 7, 2023. The entire contents thereof are herein incorporated by reference for all purposes.

FIELD OF THE INVENTION

The present disclosure relates to the technical field of power delivery device, and more particularly to a vertical power supply system and a manufacturing method of a connection board.

BACKGROUND OF THE INVENTION

In recent years, the artificial intelligence which is developed rapidly has played an increasingly critical role in large data centers, smart phones, various industrial robots, and automatic driving etc. The core technology of artificial intelligence is data processing, and the key to intelligentize data processing lies in various intelligent processor chips, such as a central processing unit (CPU), a graphics processing unit (GPU), a field programmable gate array (FPGA) and an application specific integrated circuit (ASIC). Power supply system is very important for the performance of the processor chip, and a stable power supply voltage can effectively improve the performance of the processor chip. Therefore, the steady-state and dynamic performances of the power supply system are also very important for the processor chip.

In the power supply system, the connection impedance between the power unit and the processor chip is relatively large, which directly affects the power supply performance of the power unit to the processor chip, resulting in poor performance of the processor chip, and in turn leading to poor power supply performance of the overall power supply system. Currently, the transmission impedance from the power unit to the processor chip in the power supply system can be effectively reduced through employing a vertical power supply system.

In order to improve the efficiency of the vertical power supply system in supplying power to the processor chip, the power unit and the processor chip are located on two opposite sides of a substrate. However, due to the limited size of processor chip, the number of output capacitors in the power supply system arranged per unit of area is also limited, which is not conducive to the dynamic performance of power supply. Following is the formula for calculating the voltage waveform of the output voltage in a transient state.

$$vo(t) = ic(t) * ESR + ESL * \frac{a}{dt}ic(t) + \frac{1}{C}\int_0^t ic(t)dt$$

When the number of output capacitors connected in parallel becomes more, the equivalent series resistance (ESR) and the equivalent series inductance (ESL) become smaller. Based on the calculation formula above, when the equivalent series resistance and the equivalent series inductance decrease and the output capacitance increases, the drop of the output voltage in the transient state can be reduced. Oppositely, when the output capacitance decreases, the drop of the output voltage in the transient state increases. Therefore, the quantity of output capacitors directly affects the performance of the overall vertical power supply system.

Please refer to FIG. 1 which is a schematic cross-sectional diagram showing a conventional vertical power supply system. The conventional vertical power supply system 1' includes a system board 2', a substrate 3', a power unit 4' and a chip 5'. The substrate 3' is disposed on a first surface of the system board 2' and includes a plurality of output capacitors 31' embedded therein. The power unit 4' is disposed on the substrate 3', and the substrate 3' is located between the power unit 4' and the system board 2'. The substrate 3' is used to transmit signals and power between the power unit 4' and the system board 2'. The chip 5' is disposed on a second surface of the system board 2'. Due to a higher demand of the output capacitors 31' in the conventional vertical power supply system 1', the quantity of the output capacitors 31' in the substrate 3' correspondingly becomes more, resulting in a larger area of the substrate 3' which is easily bent, and in turn causing influences on the manufacturing process. Moreover, since the output capacitors 31' are embedded in the substrate 3', the performance requirements for the output capacitors 31' are relatively high, such as the capacitor should be suitable for being embedded with high voltage tolerance and high capacitance. Furthermore, the conventional vertical power supply system 1' inevitably may experience the influences of temperature cycles and humidity during usage, and the substrate 3' and the output capacitors 31' embedded therein with different thermal expansion coefficients and equivalent expansion coefficients may result in a higher mismatch stress. Besides, due to the manufacturing process of the substrate 3', the output capacitors 31' embedded therein can only be arranged on a two-dimensional plane, and due to the embedding process of the circuit board, the gaps between the multiple output capacitors 31' are relatively large. Accordingly, the quantity of the output capacitors 31' that can be embedded in the substrate 3' within a limited space is significantly affected thereby, which is not conducive to the improvement of the total capacitance of the output capacitors 31'.

Therefore, it is necessary to develop a vertical power supply system and a manufacturing method of a connection board to solve the problems in the prior art.

SUMMARY OF THE INVENTION

An object of the present disclosure is to provide a vertical power supply system, in which a plurality of first capacitors are disposed on a second surface of a system board, a plurality of second capacitors are disposed on a third surface of a substrate, and/or a plurality of third capacitors are correspondingly disposed on side walls of conductive portions, that is, the capacitors in the vertical power supply system according to the present disclosure are not embedded in the substrate but disposed on the surface of the substrate, and further, more capacitors are disposed on the surface of the system board and/or the side walls of the conductive portions. Accordingly, the first capacitors and the second capacitors in the vertical power supply system of the present disclosure which are not embedded in the substrate can be selected to employ a material from a wider range and with a lower cost. Furthermore, because the first capacitors and the second capacitors are respectively disposed on the surfaces of the system board and the substrate, the arrangement of the capacitors in the vertical power supply system of the present disclosure can be developed in a three-dimensional manner to effectively increase the quantity of capacitors, thereby achieving the effect of improving the total capacitance of output capacitors and providing a stable working voltage to the chip unit.

In accordance with an aspect of the present disclosure, a vertical power supply system is provided. The vertical power supply system includes a system board, a substrate, a chip unit, a plurality of first capacitors, a plurality of second capacitors, a plurality of conductive portions and a power unit. The system board includes a first surface and a second surface which are opposite to each other. The substrate includes a third surface and a fourth surface which are opposite to each other, and the third surface is located between the fourth surface and the second surface of the system board. The chip unit is disposed on the first surface. The plurality of first capacitors are disposed on the second surface. The plurality of second capacitors are disposed on the third surface. The third surface and the second surface are electrically connected through the plurality of conductive portions. The power unit is disposed on the fourth surface.

In accordance with another aspect of the present disclosure, a vertical power supply system is provided. The vertical power supply system includes a system board, a substrate, a chip unit, a plurality of first capacitors, a plurality of conductive portions, a plurality of third capacitors and a power unit. The system board includes a first surface and a second surface which are opposite to each other. The substrate includes a third surface and a fourth surface which are opposite to each other, and the third surface is located between the fourth surface and the second surface of the system board. The chip unit is disposed on the first surface. The plurality of first capacitors are disposed on the second surface. Each of the plurality of connection boards includes a first end, a second end and a side wall, the first end and the second end are opposite to each other, the first end is electrically connected to the second surface of the system board, the second end is electrically connected to the third surface of the substrate, and the side wall is disposed between the first end and the second end in a surrounding manner. The plurality of third capacitors are disposed on the side wall. The power unit is disposed on the fourth surface.

In accordance with another aspect of the present disclosure, a manufacturing method of a connection board adapted in a vertical power supply system is provided. The method includes the following steps. Firstly, a circuit board is provided, wherein an upper surface and a lower surface of the circuit board are covered by a metal layer. Then, a plurality of through holes are formed on the circuit board. The circuit board is plated to form a first plating layer on the upper surface, the lower surface and the plurality of through holes. Following, a pattern layer is respectively formed on the upper surface and on the lower surface of the circuit board, wherein the pattern layer on the upper surface is connected to the pattern layer on the lower surface through the plurality of through holes. Further, a plurality of pads are formed on the circuit board, and a second plating layer is formed on the upper surface and the lower surface of the circuit board, wherein the plurality of pads are corresponding to the pattern layer. Then, a third capacitor is disposed on a corresponding pad of the plurality of pads on the upper surface and the lower surface of the circuit board. Finally, the circuit board is cut in accordance with positions of the plurality of through holes to form at least one connection board, and a plating surface within the plurality of through holes is at least partially exposed at one end of the connection board.

BRIEF DESCRIPTION OF THE DRAWINGS

The above contents of the present disclosure will become more readily apparent to those ordinarily skilled in the art after reviewing the following detailed description and accompanying drawings, in which.

REFERENCE NUMBERS

1': Conventional Vertical Power Supply System
2': System Board                         3': Substrate
31': Output Capacitors                    4': Power Unit
5': Chip
1, 1a, 1b, 1c, 1d, 1e: Vertical Power Supply
System
2: System Board                           21: First Surface
22: Second Surface                        3: Substrate
31: Third Surface                         32: Fourth Surface
33: First Pin                             34: Second Pin
35: First Conductive Structure            36: Trench
37: Second Conductive Structure           38: Connecting Lead
4: Chip Unit                              51: First Capacitor
52: Second Capacitor                      53: Third Capacitor
6: Conductive Portion                     60: Connection board
61: First End -continued

| 62: Second End | 63: Side Wall |
| 7: Power Unit | 81: Copper Clad Board |
| 82: Half-Cured Sheet | 83: Circuit Board |
| 84: Through Hole | 85: First Plating Layer |
| 86: Pattern Layer | 87: Pad |

DETAILED DESCRIPTION

The present disclosure will now be described more specifically with reference to the following embodiments. It is to be noted that the following descriptions of embodiments of this disclosure are presented herein for purpose of illustration and description only. It is not intended to be exhaustive or to be limited to the precise form disclosed.

Figure 1:
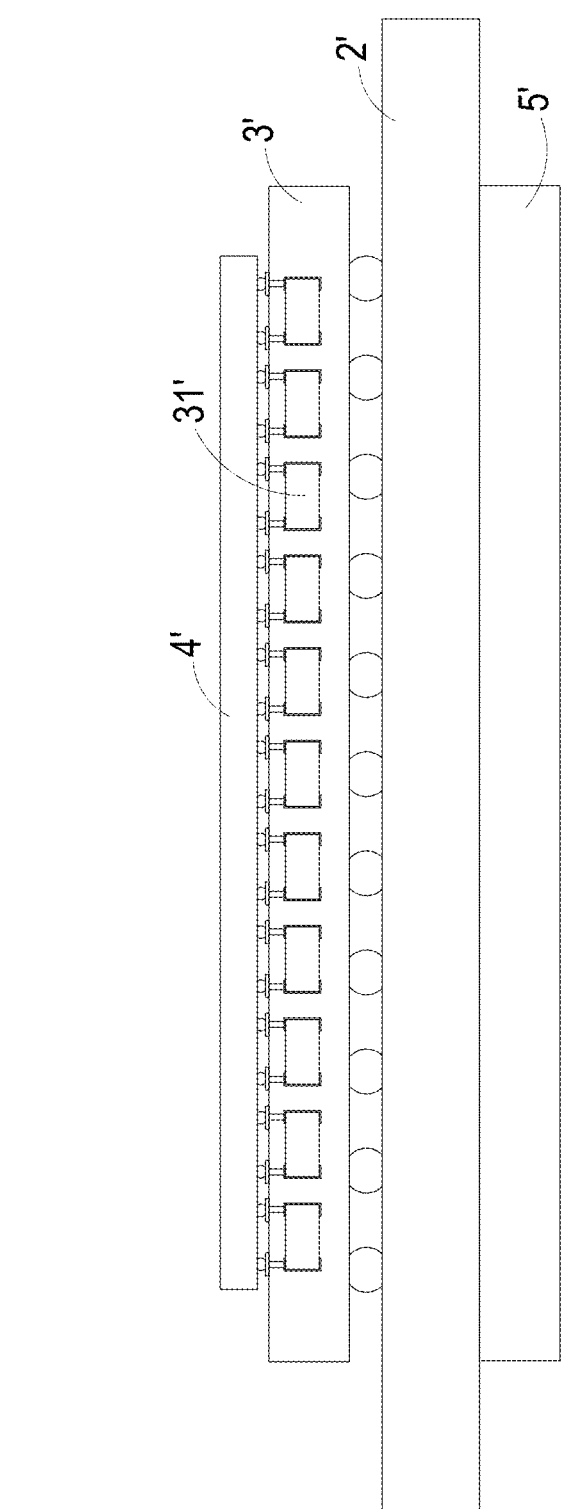
FIG. 1 is a schematic cross-sectional diagram showing a conventional vertical power supply system.
Figure 2:
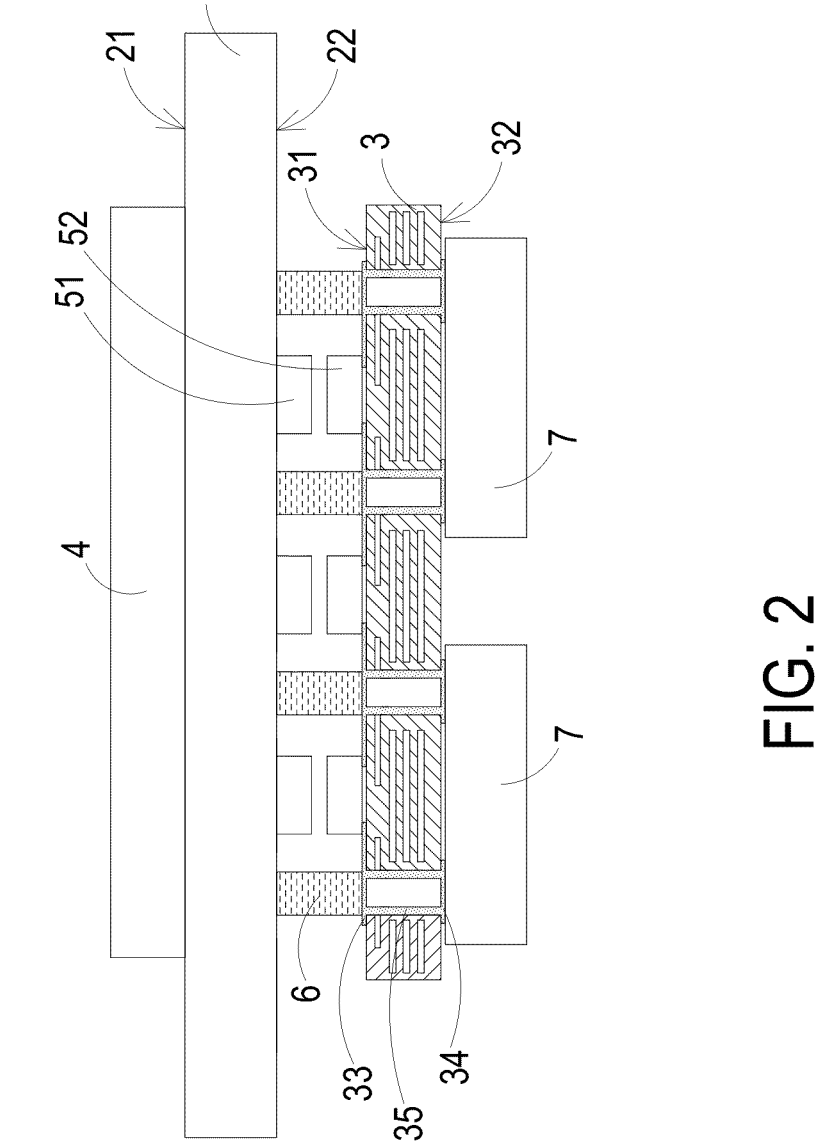
FIG. 2 is a schematic cross-sectional diagram showing a vertical power supply system according to a first embodiment of the present disclosure.
Figure 3:
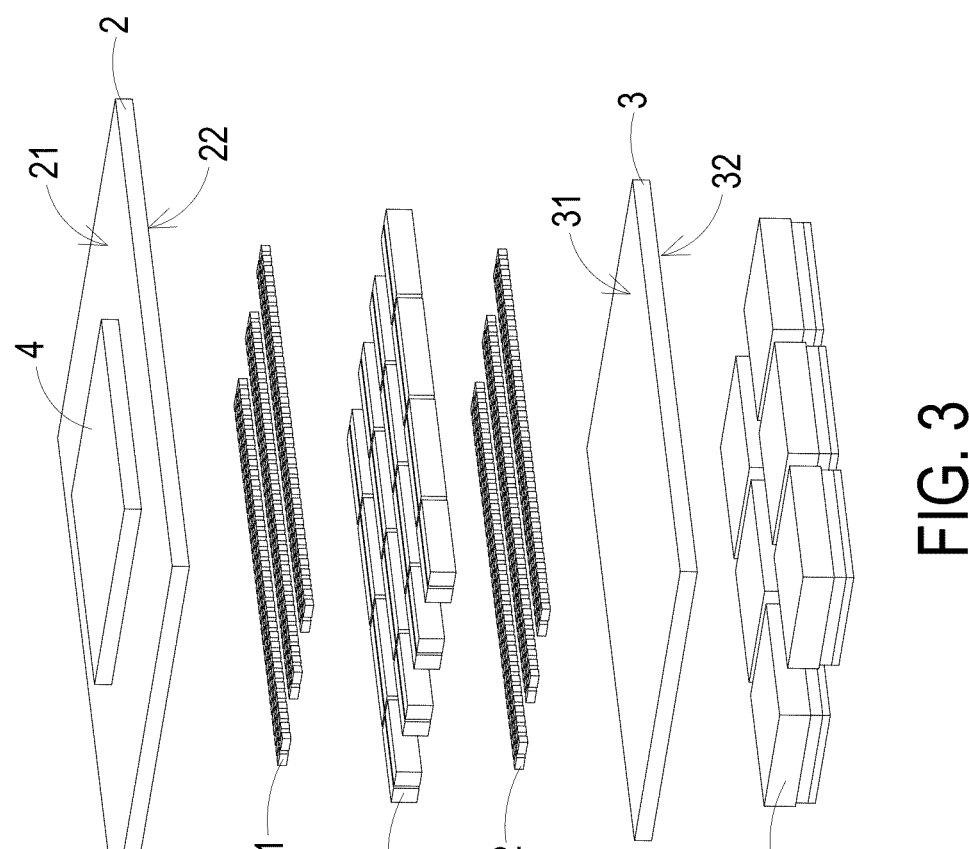
FIG. 3 is an exploded view of the vertical power supply system in FIG. 2.

Please refer to FIG. 2 and FIG. 3. FIG. 2 is a schematic cross-sectional diagram showing a vertical power supply system according to a first embodiment of the present disclosure, and FIG. 3 is an exploded view of the vertical power supply system in FIG. 2. In this embodiment, a vertical power supply system 1 includes a system board 2, a substrate 3, a chip unit 4, a plurality of first capacitors 51, a plurality of second capacitors 52, a plurality of conductive portions 6 and power units 7. The system board 2 includes a first surface 21 and a second surface 22, and the first surface 21 and the second surface 22 are opposite to each other. The substrate 3 includes a third surface 31 and a fourth surface 32, and the third surface 31 and the fourth surface 32 are opposite to each other. The third surface 31 of the substrate 3 is located between the fourth surface 32 and the second surface 22 of the system board 2. Exemplarily, the chip unit 4 is a central processing unit, a graphics processing unit, a tensor processing unit (TPU) or a neural network processing unit (NPU), and the chip unit 4 is disposed on the first surface 21 of the system board 2.

In some embodiments, the plurality of first capacitors 51 are output capacitors and disposed on the second surface 22 of the system board 2. Exemplarily, the first capacitors 51 are selected to have appropriate frequency characteristics in accordance with the operating frequency of the chip unit 4. The first capacitors 51 are equipped with functions of filtering and energy storage, and at the same time, are capable of eliminating the high frequency noises of the vertical power supply system 1, so as to provide a purified current for the chip unit 4. The first capacitors 51 further provide the supplementary current when the chip unit 4 is switched between different operating states for reducing the voltage drop and stabilizing the operation of the chip unit 4. The plurality of second capacitors 52 are disposed on the third surface 31 of the substrate 3. Further, the second capacitors 52 are equipped with functions of filtering and energy storage and capable of stabilizing the operation of the chip unit 4. Each of the conductive portions 6 is a conductive column and is disposed between the second surface 22 of the system board 2 and the third surface 31 of the substrate 31, so that the second surface 22 of the system board 2 and the third surface 31 of the substrate 31 are electrically connected through the conductive portions 6. The power units 7 are disposed on the fourth surface 32 of the substrate 3.

Accordingly, the present disclosure provides a vertical power supply system 1, in which the plurality of first capacitors 51 are disposed on the second surface 22 of the system board 2 and the plurality of second capacitors 52 are disposed on the third surface 31 of the substrate 3, that is, the capacitors in the vertical power supply system 1 of the present disclosure are not embedded in the substrate 3 but disposed on the surface of the substrate 3. Moreover, other than disposing the capacitors on the surface of the substrate 3, there are also capacitors disposed on the surface of the system board 2, so that, compared with the conventional vertical power supply system which has the capacitors embedded in the substrate, the first capacitors 51 and the second capacitors 52 in the vertical power supply system 1 of the present disclosure which are not embedded in the substrate can be selected to employ a material from a wider range and with a lower cost. Furthermore, because the first capacitors 51 and the second capacitors 52 are respectively disposed on the surfaces of the system board 2 and the substrate 3, the arrangement of the capacitors in the vertical power supply system 1 can be developed in a three-dimensional manner to effectively increase the quantity of capacitors, thereby achieving the effect of improving the total capacitance of output capacitors and providing a stable working voltage to the chip unit 4.

Please refer to FIG. 2. In order to increase the quantity of capacitors per unit of area, in this embodiment, each of the second capacitors 52 is positioned between a corresponding first capacitor 51 and the third surface 31 of the substrate 3, and each of the first capacitors 51 is positioned between a corresponding second capacitor 52 and the second surface 22 of the system board 2.

Please refer to FIG. 2. The substrate 3 further includes a plurality of first pins 33, a plurality of second pins 34, and a plurality of first conductive structures 35. The plurality of first pins 33 are disposed on the third surface 31 of the substrate 3, and each of the second capacitors 52 and each of the plurality of conductive portions 6 are respectively disposed on and electrically connected to a corresponding first pin 33. The plurality of second pins 34 are disposed on the fourth surface 32 of the substrate 3, and each of the power units 7 is disposed on a corresponding second pin 34, and an output terminal of each of the power units 7 is electrically connected to the corresponding second pin 34. Each of the first pins 33 is electrically connected to a corresponding second pin 34 through a corresponding first conductive structure 35. Exemplarily, the first conductive structure 35 includes a via or a blind hole. In the embodiment shown in FIG. 2, the first conductive structure 35 is a via. In another embodiment, the first conductive structure 35 is a blind hole, and a conductive layer (not shown) is further formed in the substrate 3, wherein the first pin 33 and the corresponding second pin 34 are electrically connected to the conductive layer respectively through the corresponding first conductive structure in the form of blind hole, and thus, the second capacitor 52 disposed on the first pin 33 is electrically connected to the output terminal of the corresponding power unit 7 through the first conductive structure 35.

Figure 4A:
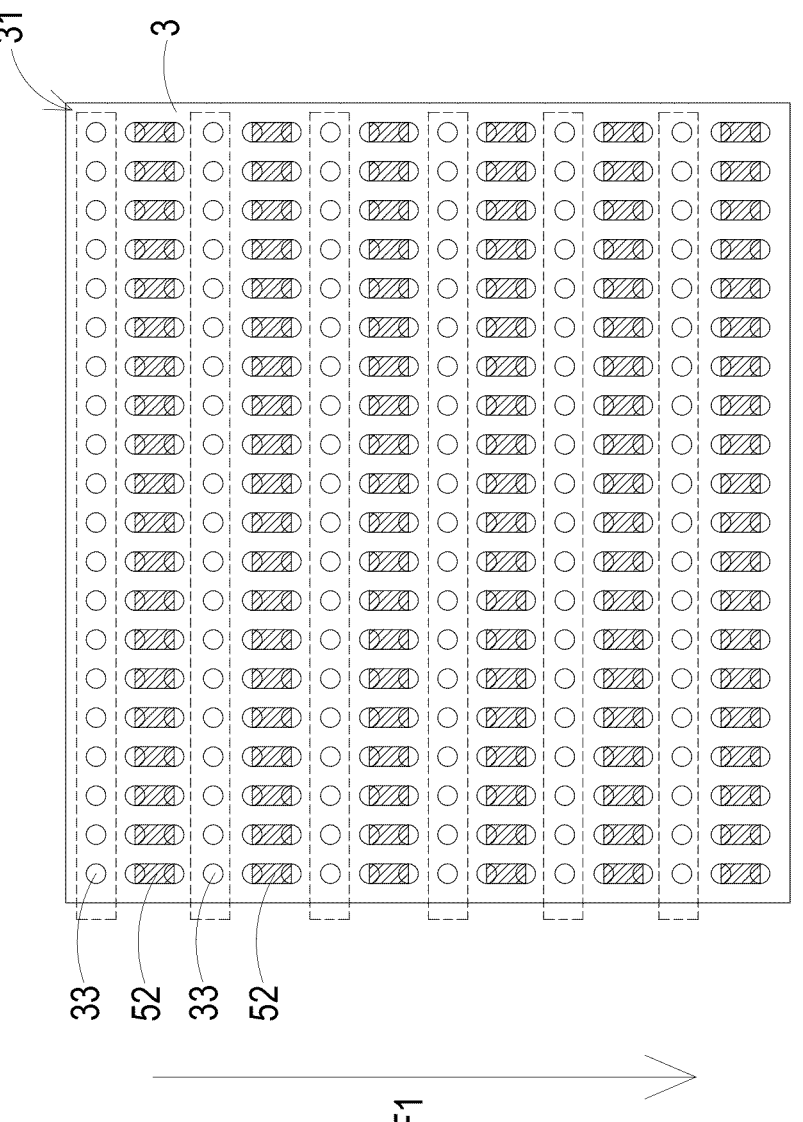
FIG. 4A is schematic view showing an arrangement of elements on a third surface of a substrate in the vertical power supply system in FIG. 2.
Figure 4B:
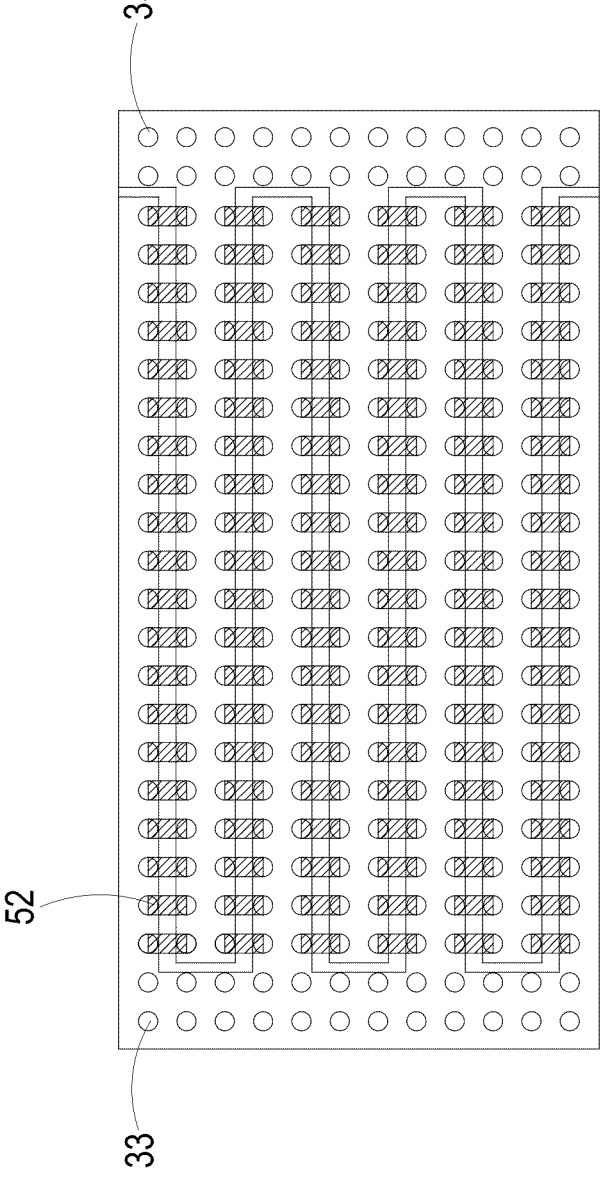
FIG. 4B is schematic view showing another arrangement of elements on the third surface of the substrate in the vertical power supply system in FIG. 2.

Please refer FIG. 4A and FIG. 2 to FIG. 3. FIG. 4A is a schematic view showing an arrangement of elements on the third surface of the substrate in the vertical power supply system in FIG. 2. As shown in FIG. 3, the plurality of conductive portions 6 are arranged to form a plurality of first arrangement rows, the plurality of first capacitors 51 are arranged to form a plurality of second arrangement rows, and the plurality of second capacitors 52 are arranged to form a plurality of third arrangement rows. The second arrangement rows are adjacent to and aligned with the third arrangement rows one by one in a vertical direction, and each pair of aligned second arrangement row and third arrangement row are located between two adjacent first arrangement rows in a horizontal direction. In some embodiments, plural pairs of second arrangement rows and third arrangement rows are arranged between two adjacent first arrangement rows. The arrangements of the first arrangement rows, the second arrangement rows and the third arrangement rows are not limited thereto. As shown in FIG. 4A, because the conductive portions 6 are disposed on the corresponding first pins 33, the first pins 33 as shown in FIG. 2 are also arranged to form a plurality of first arrangement rows and are alternately arranged with the plurality of third arrangement rows formed by the plurality of second capacitors 52. It is also possible to arrange plural third arrangement rows between two adjacent first arrangement rows, and the arrangements of the first arrangement rows and the third arrangement rows are not limited thereto. Notably, the conductive portions 6, the first capacitors 51 and the second capacitors 52 are not limited to be arranged in rows, and can be varied in accordance with practical requirements. For example, in some embodiments, the first pins 33 corresponding to the conductive portions 6 also can be arranged to locate at two sides of the first capacitors 51 and the second capacitors 52, as shown in FIG. 4B, so that the conductive portions 6 are arranged at two sides of the first capacitors 51 and the second capacitors 52. However, in this condition, a necessity is at least one first capacitor 51 is arranged between the corresponding first pins 33 of two adjacent conductive portions 6, and also, at least one second capacitor 52 is arranged between the corresponding first pins 33 of two adjacent conductive portions 6, namely, at least one first capacitor 51 is arranged between two adjacent conductive portions 6, and also, at least one second capacitor 52 is arranged between two adjacent conductive portions 6. Further, as shown in FIG. 4A, the installation direction of each of the second capacitors 52 can be arranged parallel or perpendicular to a longitudinal direction of the substrate 3, and the installation direction of each of the first capacitors 51 (not shown in FIG. 4A) is similar to that of the second capacitor 52, wherein the longitudinal direction of the substrate 3 is the direction indicated by F1 shown in FIG. 4A. In order to increase the quantity of the first capacitors 51 and the second capacitors 52 arranged in the limited space, the installations of both exemplarily remain identical, so that the first capacitors 51 and the second capacitors 52 are correspondingly matched to each other in the vertical direction, that is, the projection of each of the first capacitors 51 on the second surface 22 of the system board 2 and the projection of each of the second capacitors 51 on the second surface 22 of the system board 2 are partially or completely overlapped. Consequently, it is known from the above that, in the vertical power supply system 1 according to the present disclosure, the first capacitors 51 and the second capacitors 52 are stacked in two layers, so that a large amount of capacitors can be disposed in the limited space, so as to meet the required output capacitance for the vertical power supply system 1.

Figure 5A:
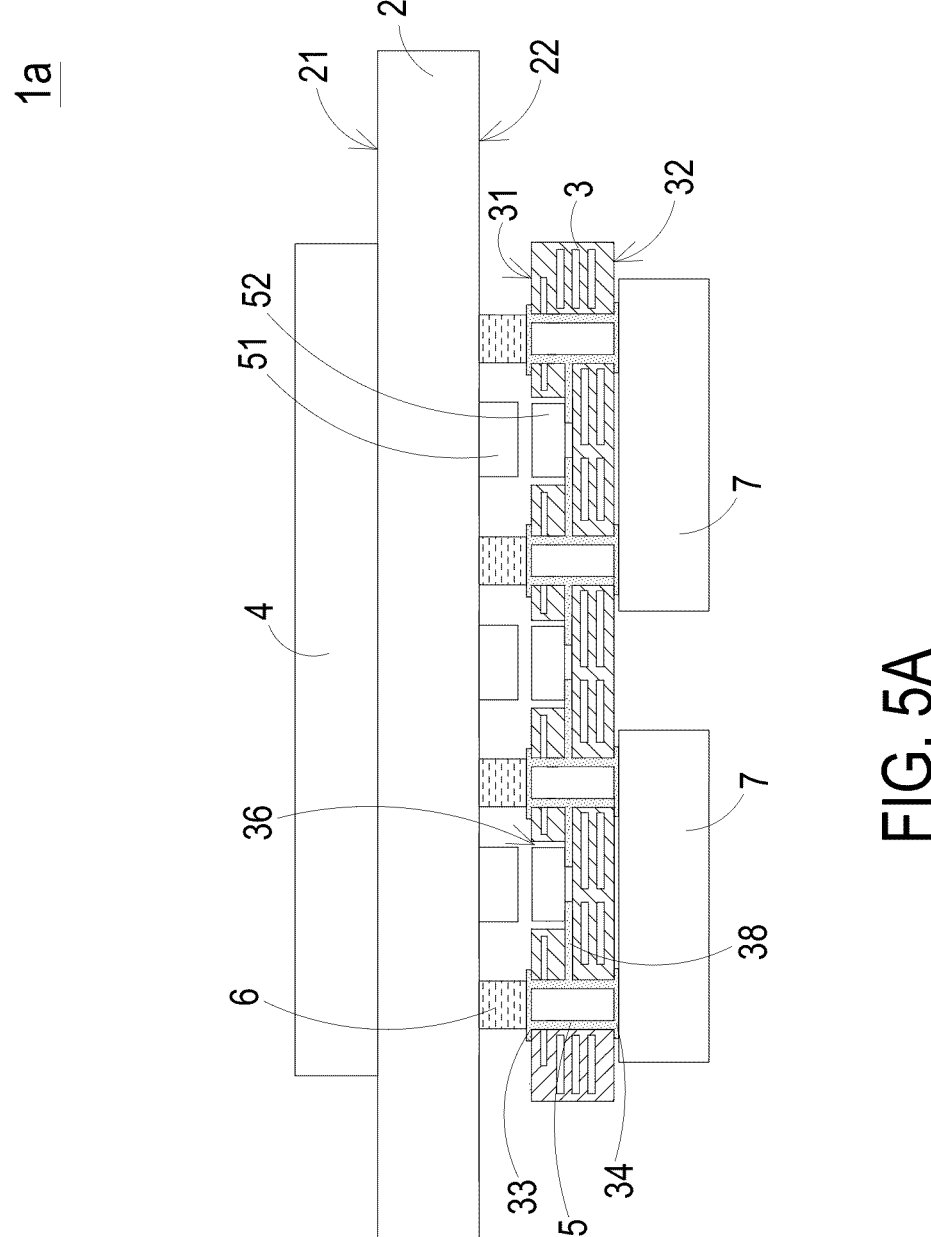
FIG. 5A is a schematic cross-sectional diagram showing a vertical power supply system according to a second embodiment of the present disclosure.

Please refer FIG. 5A which is a schematic cross-sectional diagram showing a vertical power supply system according to a second embodiment of the present disclosure. Compared with the vertical power supply system 1 in FIG. 2, in a vertical power supply system 1a as shown in FIG. 5A, the substrate 3 further includes a plurality of trenches 36 and a plurality of connecting leads 38. The plurality of trenches 36 are concavely formed from the third surface 31 of the substrate 3. The trenches 36 are used to accommodate the second capacitors 52, and the second capacitors 52 are disposed in the trenches 36 through a process such as spot welding of solder paste, patching, reflow soldering or the like. Each connecting lead 38 is connected between a corresponding trench 36 and a corresponding first conductive structure 35, namely, the second capacitor 52 disposed in the trench 36 is electrically connected to the first conductive structure 35 through the connecting lead 38, and the second capacitor 52 disposed in the trench 36 is electrically connected to the output terminal of the corresponding power unit 7, which is disposed on the corresponding second pin 34, through the connecting lead 38 and the first conductive structure 35. In the vertical power supply system 1a, since the second capacitor 52 is disposed in the trench 36 of the substrate 3, the height of the second capacitor 52 protruded from the third surface 31 of the substrate 3 is reduced, resulting in a reduced height of the conductive portion 6, and thus, the power supplying distance between the chip unit 4 and the power unit 7 is also shortened to reduce the total loop impedance.

Figure 5B:
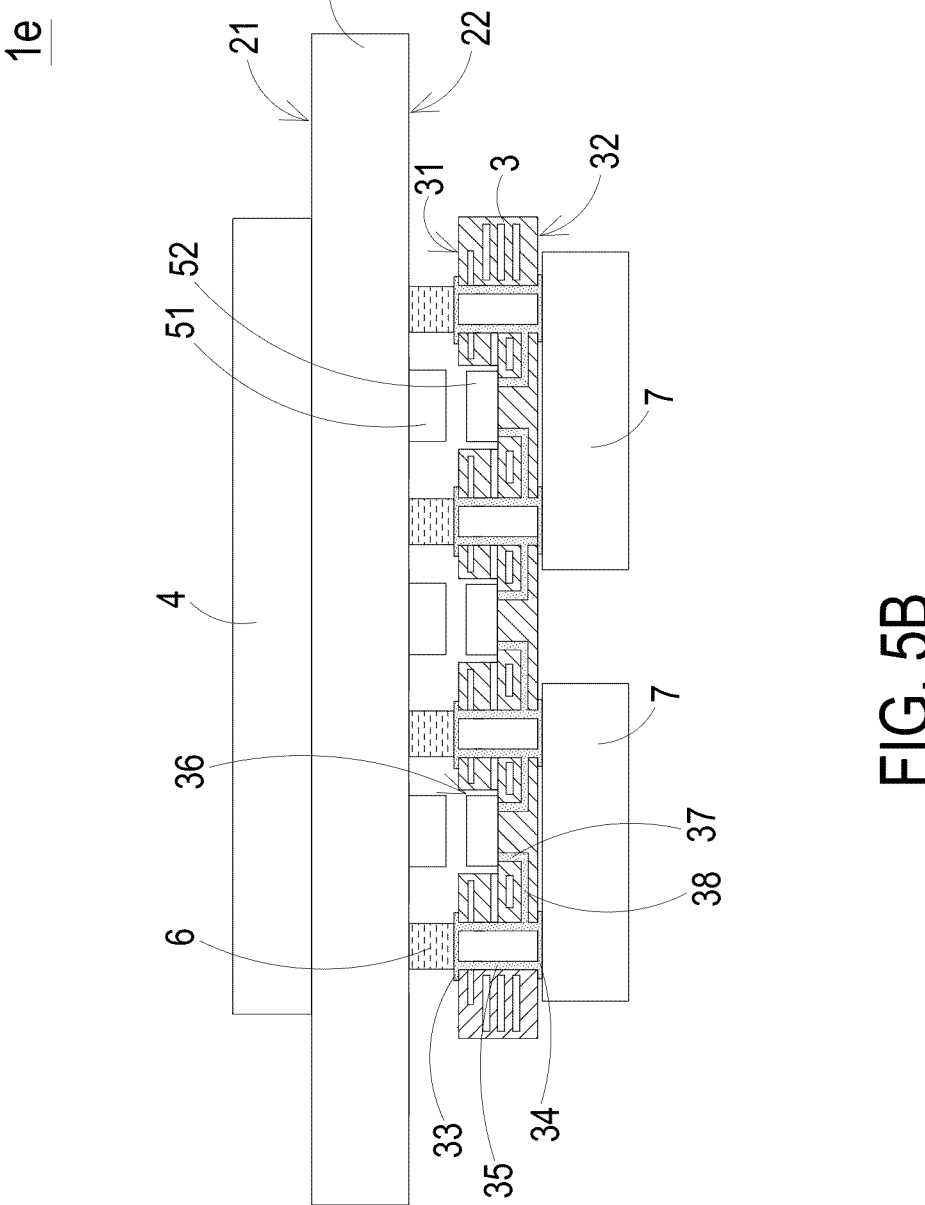
FIG. 5B is a schematic cross-sectional diagram showing a vertical power supply system according to a third embodiment of the present disclosure.

Please refer to FIG. 5B which is a schematic cross-sectional diagram showing a vertical power supply system according to a third embodiment of the present disclosure. Compared with the vertical power supply system 1 in FIG. 2, in a vertical power supply system 1e as shown in FIG. 5B, the substrate 3 further includes a plurality of trenches 36, a plurality of second conductive structures 37 and a plurality of connecting leads 38. The plurality of trenches 36 are concavely formed from the third surface 31 of the substrate 3. The trenches 36 are used to accommodate the second capacitors 52, and the second capacitors 52 are disposed in the trenches 36 through a process such as spot welding of solder paste, patching, reflow soldering or the like. Each of the second conductive structures 37 is connected to a corresponding trench 36 and is arranged in a direction parallel to the first conductive structure 35. Each of the connecting leads 38 is connected between a corresponding second conductive structure 37 and a corresponding first conductive structure 35, and is arranged in a direction perpendicular to the corresponding second conductive structure 37 and the corresponding first conductive structure 35. That is, the second capacitor 52 disposed in the trench 36 is electrically connected to the first conductive structure 35 through the second conductive structure 37 and the connecting lead 38, and the second capacitor 52 disposed in the trench 36 is electrically connected to the output terminal of the corresponding power unit 7, which is disposed on the corresponding second pin 34, through the second conductive structure 37, the connecting lead 38 and the first conductive structure 35.

Figure 6:
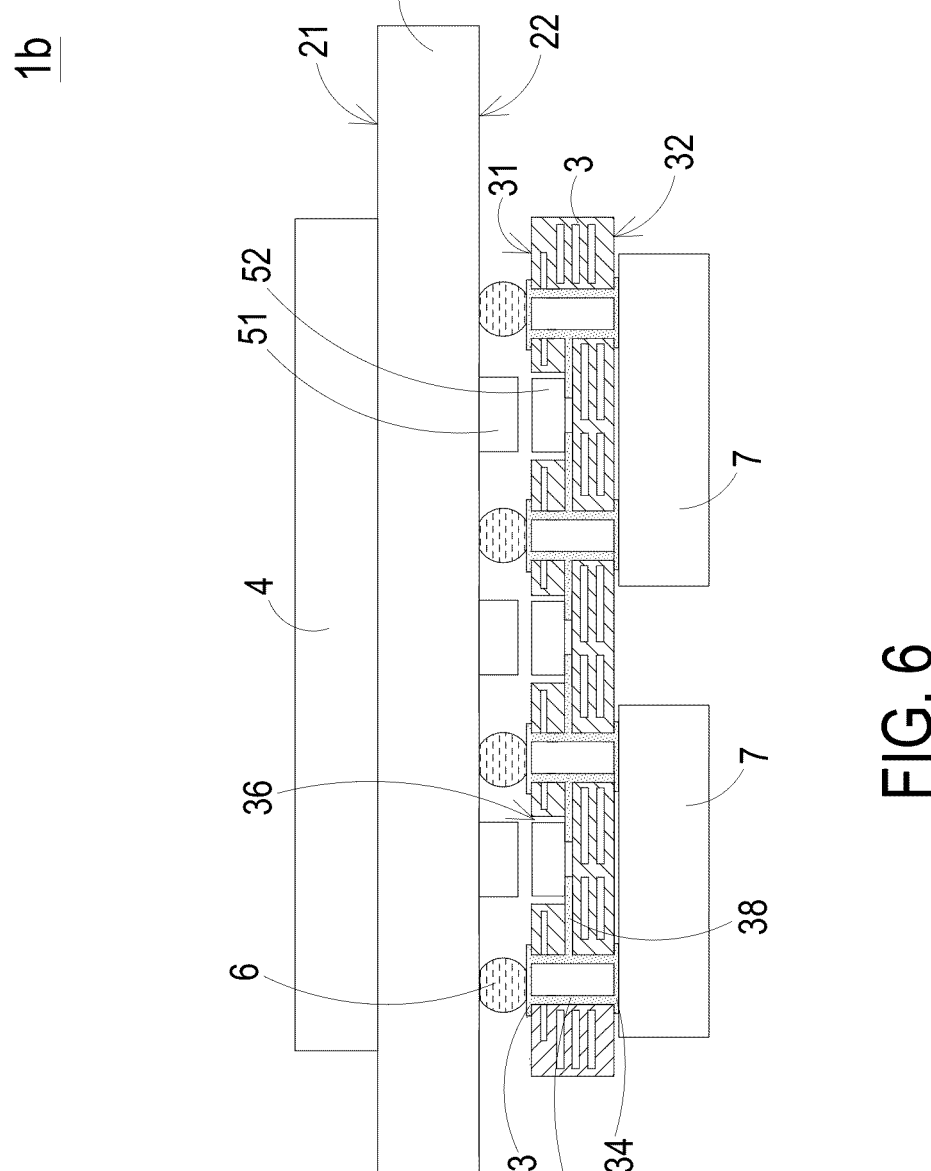
FIG. 6 is a schematic cross-sectional diagram showing a vertical power supply system according to a fourth embodiment of the present disclosure.

Please refer to FIG. 6 which is a schematic cross-sectional diagram showing a vertical power supply system according to a fourth embodiment of the present disclosure. Compared with the vertical power supply system 1a in FIG. 5A in which the conductive portions 6 are implemented to be conductive columns, in a vertical power supply system 1b as shown in FIG. 6, the conductive portions 6 are implemented to be solder balls. The solder balls can be ball grid array (BGA) solder balls, or solder balls with high temperature cores, such as copper cores or high melting point solder cores. In an embodiment of the vertical power supply system 1b, the solder balls with high temperature cores are disposed at four corners of the substrate 3 and regular solders are disposed at other positions of the substrate 3 for avoiding the collapse of the solder balls, thereby improving the process yield.

Figure 7:
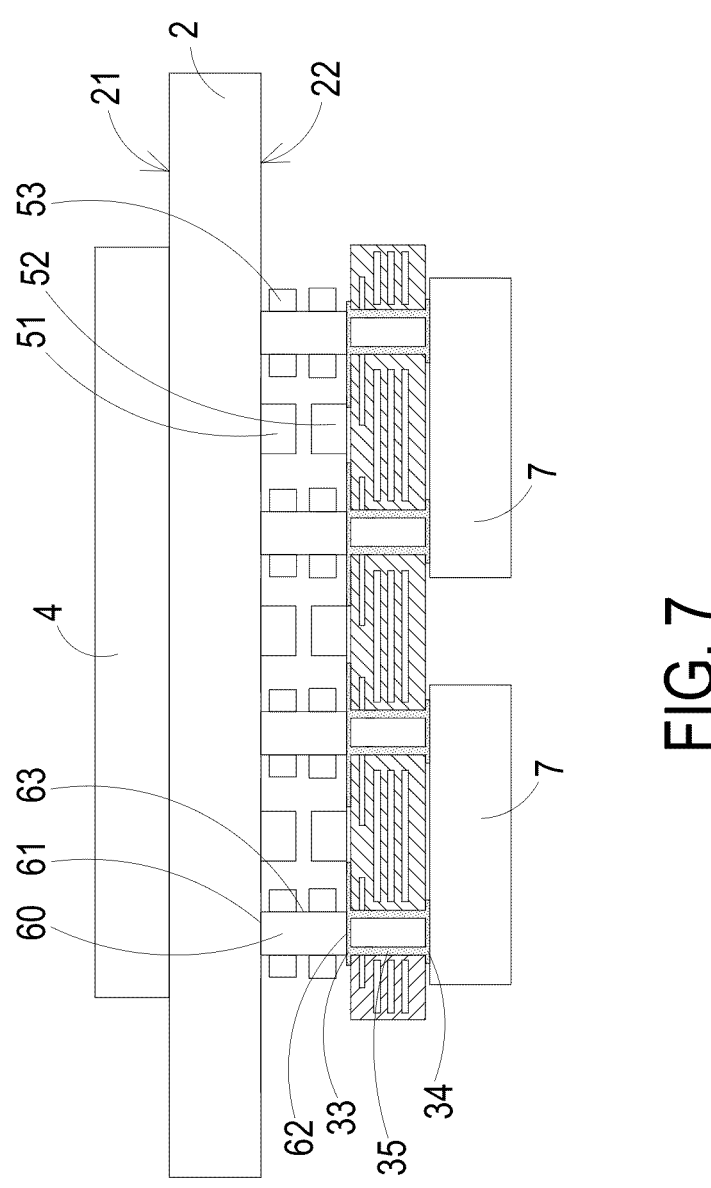
FIG. 7 is a schematic cross-sectional diagram showing a vertical power supply system according to a fifth embodiment of the present disclosure.
Figure 8:
FIG. 8 is an exploded view of the vertical power supply system in FIG. 7.
Figure 8:
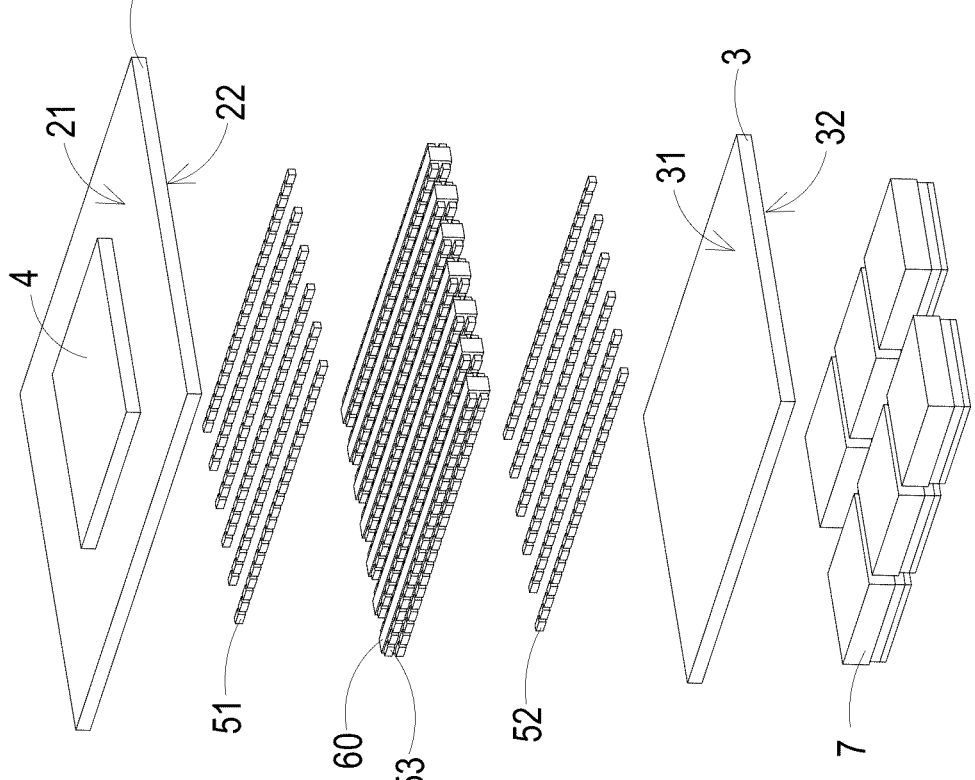

Please refer FIG. 7 and FIG. 8. FIG. 7 is a schematic cross-sectional diagram showing a vertical power supply system according to a fifth embodiment of the present disclosure, and FIG. 8 is an exploded view of the vertical power supply system in FIG. 7. Compared with the vertical power supply system 1 in FIG. 2, in a vertical power supply system 1c of this embodiment, the conductive portions 6 are implemented to be connection boards 60, and each connection board 60 includes a first end 61, a second end 62 and a side wall 63. The first end 61 and the second end 62 are opposite to each other, and the side wall 63 is disposed between the first end 61 and the second end 62 in a surrounding manner. The first end 61 of the connecting board 60 is electrically connected to the second surface 22 of the system board 2 and the second end 62 of the connection board 60 is electrically connected to third surface 31 of the substrate 3. In this embodiment, the vertical power supply system 1c further includes a plurality of third capacitors 53, and each of the third capacitors 53 is disposed on the side wall 63 of a corresponding connection board 60. Therefore, as shown in FIG. 8, there have the corresponding first capacitor 51, the corresponding second capacitor 52 and the corresponding third capacitor 53 disposed between two adjacent conductive boards 60, so that the quantity of capacitors in the vertical power supply system 1c is further increased. Besides, since the position of the third capacitor 53 is closer to the chip unit 4 than the second capacitor 52, the functions of filtering and energy storage of the third capacitor 53 are more effective, which is beneficial to stabilize the operation of the chip unit 4.

Figure 9:
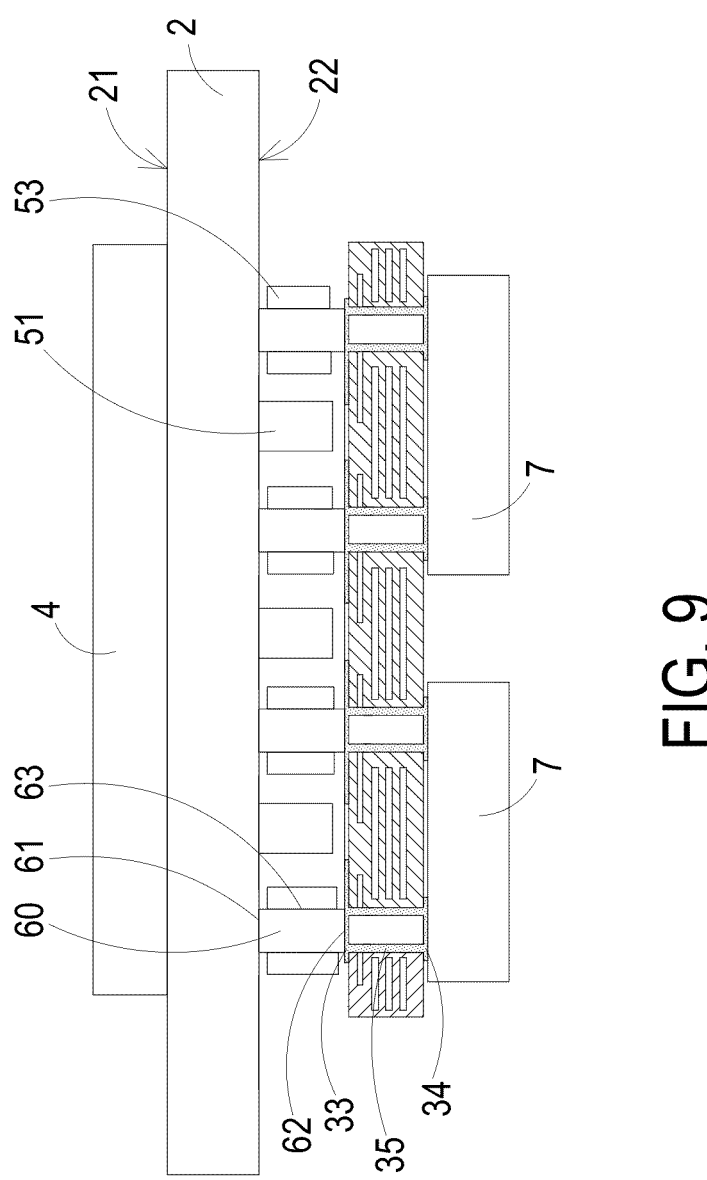
FIG. 9 is a schematic cross-sectional diagram showing a vertical power supply system according to a sixth embodiment of the present disclosure.

Please refer to FIG. 9 which is a schematic cross-sectional diagram showing a vertical power supply system according to a sixth embodiment of the present disclosure. Compared with the vertical power supply system 1c in FIG. 7 and FIG. 8, a vertical power supply system 1d in this embodiment only includes a plurality of first capacitors 51 and a plurality of third capacitors 53 without the second capacitor. Of course, the positions and the quantities of the first capacitors 51 and the third capacitors 53 can be varied in accordance with the practical requirements without limitation.

Figure 10:
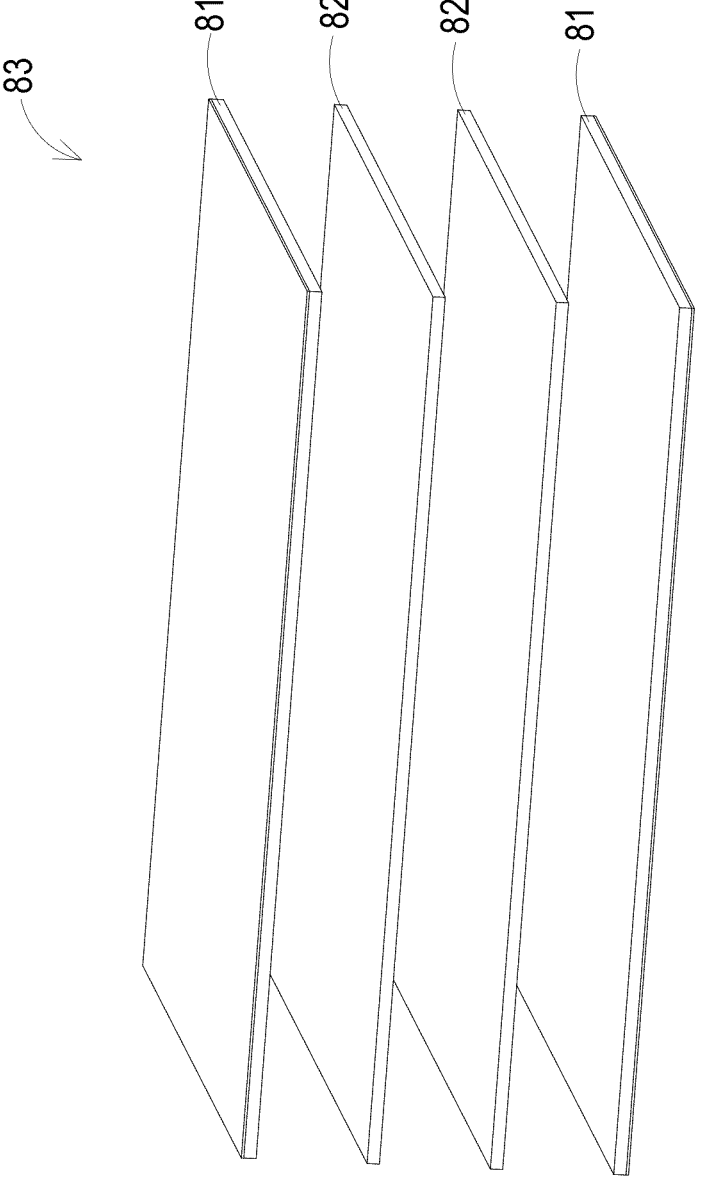
FIGS. 10 to 17B are schematic views showing a manufacturing method of connection boards and third capacitors in the vertical power supply system of FIG. 8.
Figure 11:
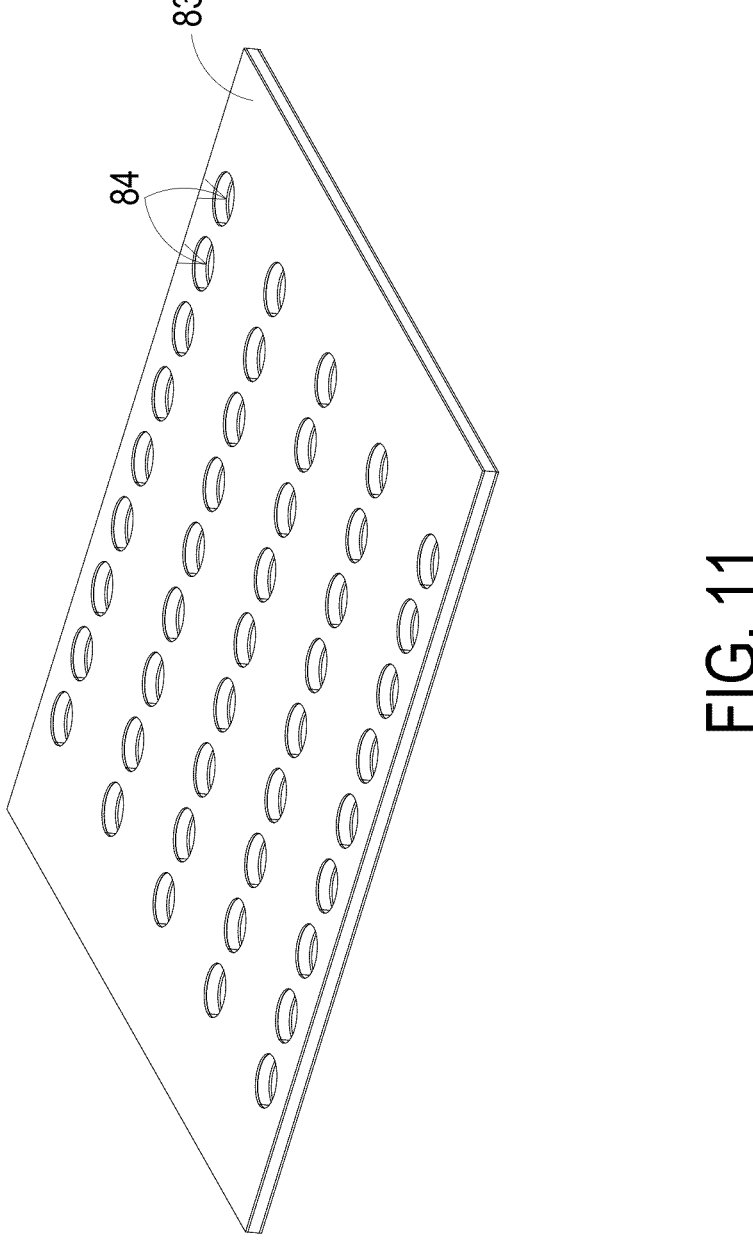
Figure 12:
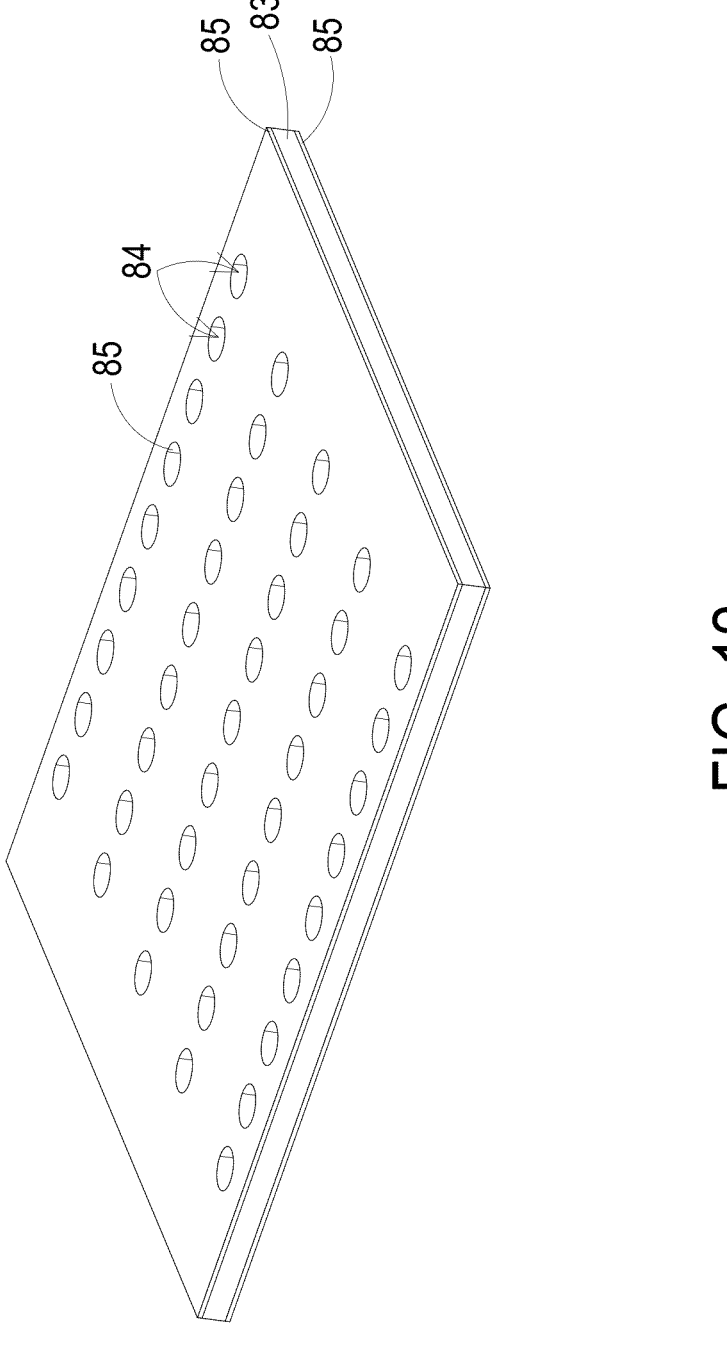
Figure 13:
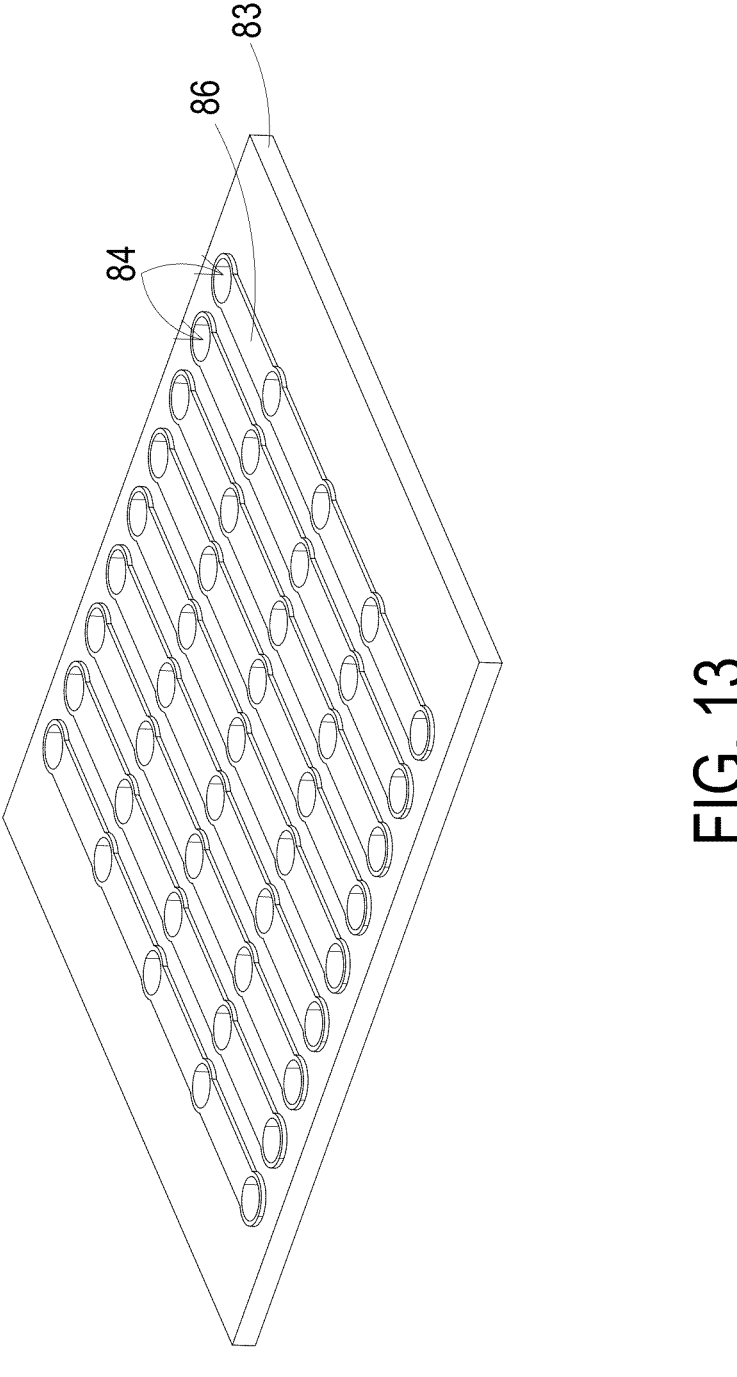
Figure 14:
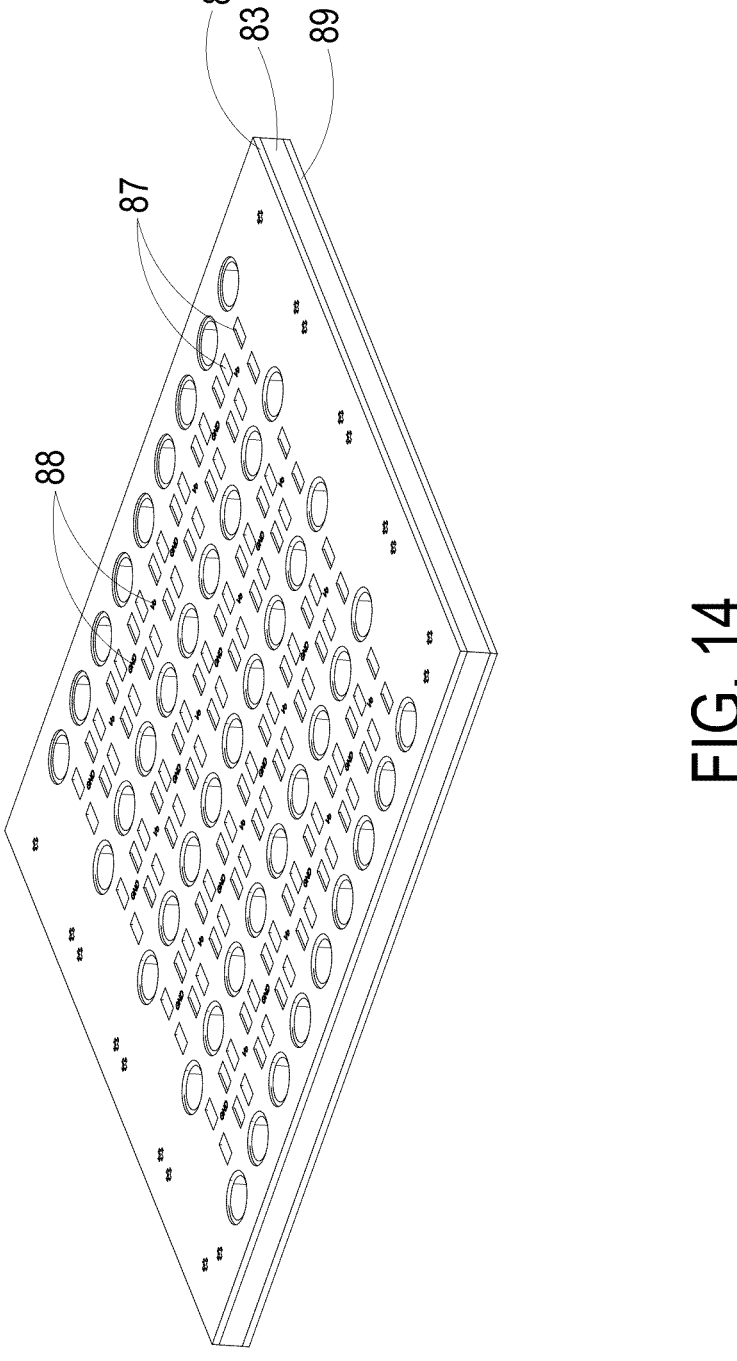
Figure 15:
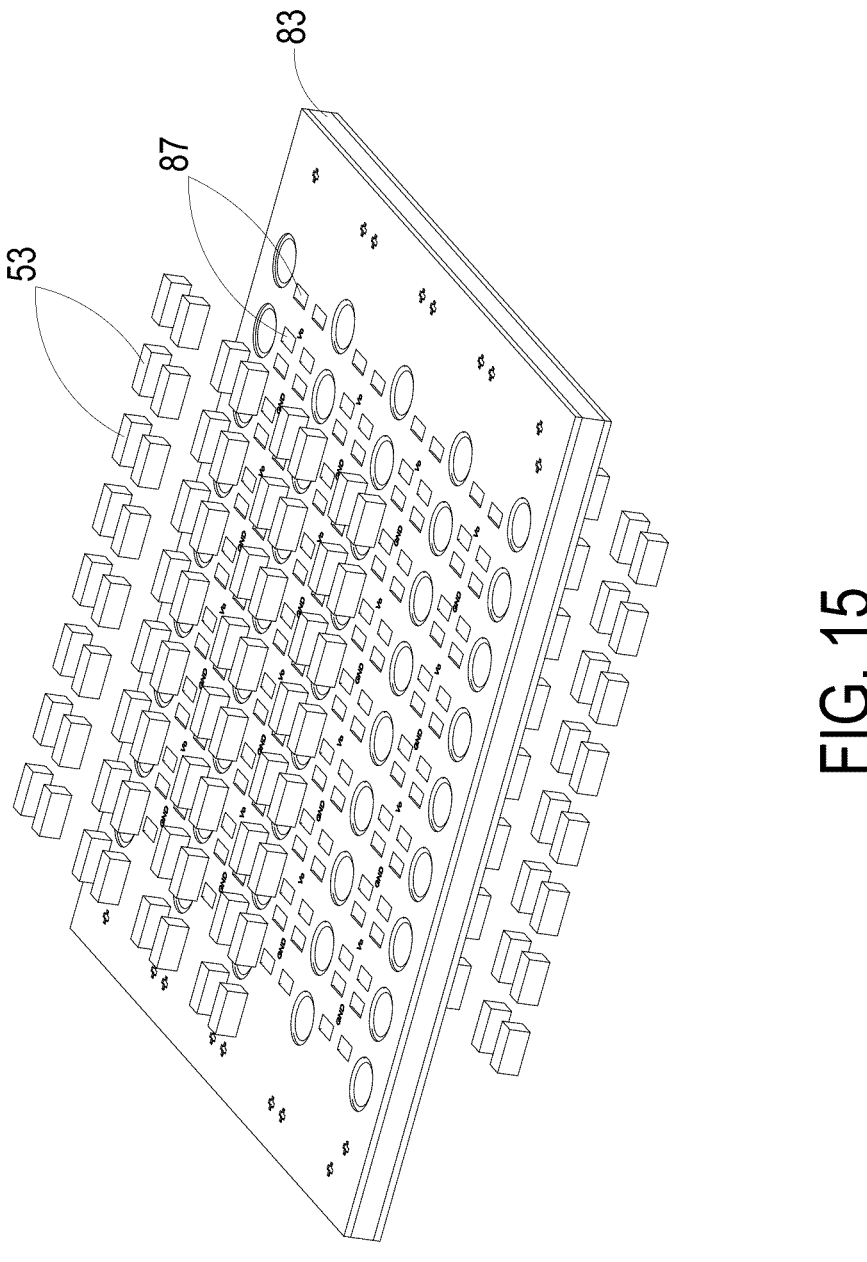
Figure 16A:
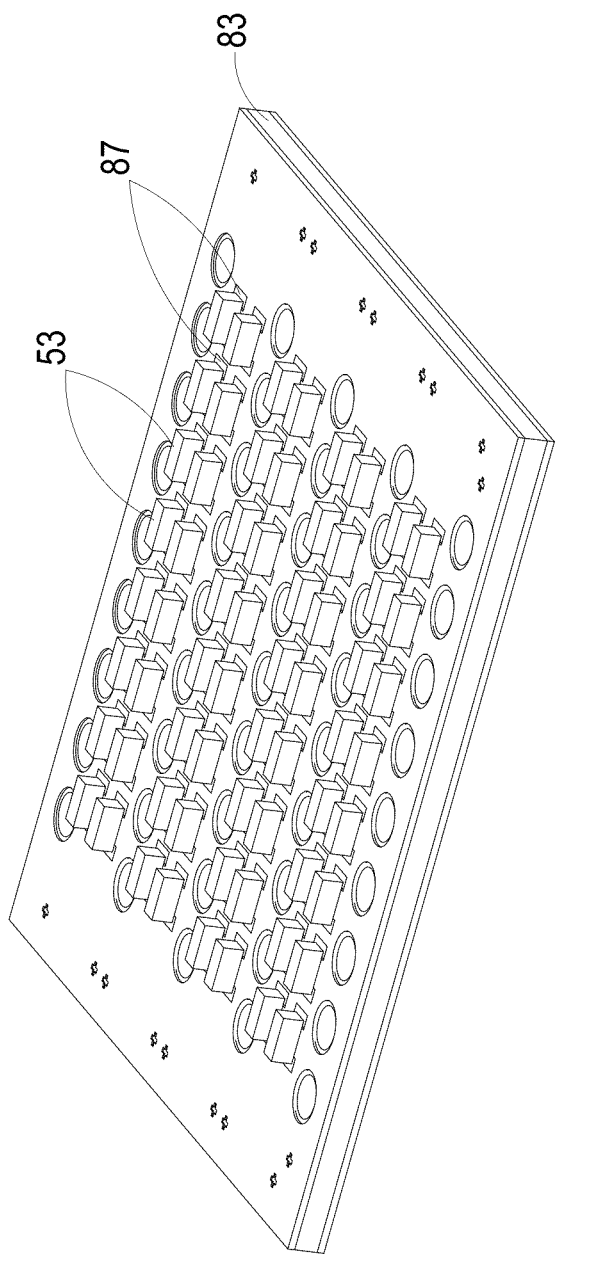
Figure 16B:
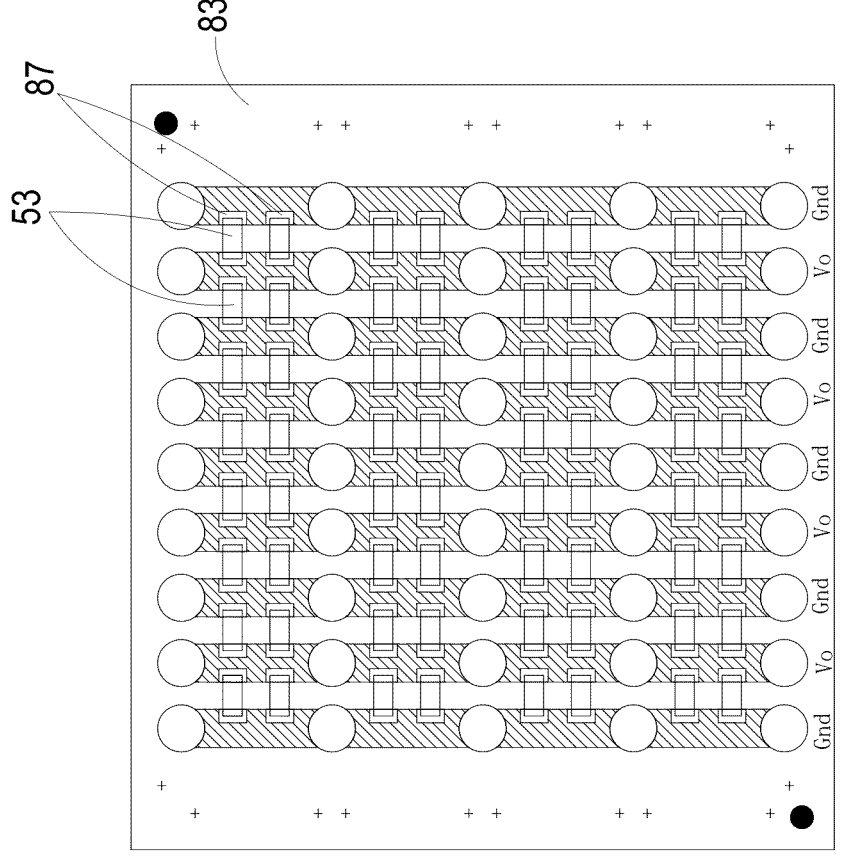
Figure 17A:
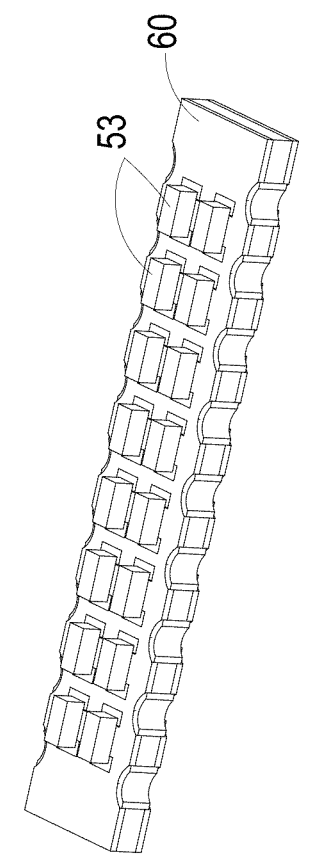
Figure 17B:
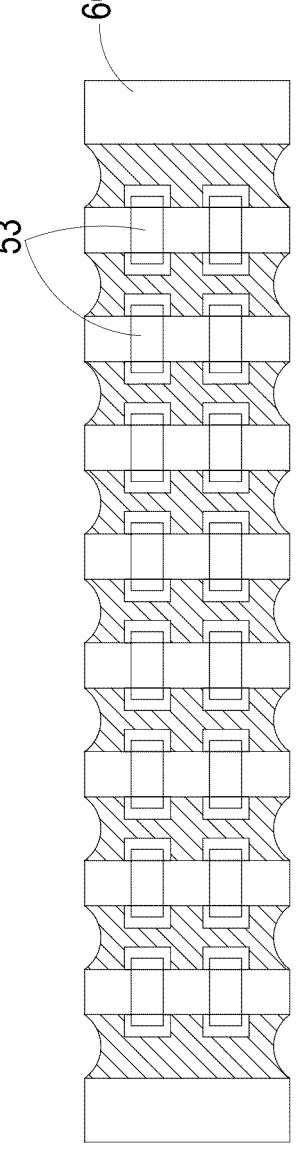

Following is the manufacturing method of the connection boards 60, used as the conductive portions 6, and the third capacitors 53. Please refer to FIG. 10 to FIG. 17B which are schematic views showing the manufacturing method of the connection board and the third capacitor in the vertical power supply system of FIG. 8. Firstly, a circuit board 83 is provided, and an upper surface and a lower surface of the circuit board 83 are covered by a metal layer, wherein the material of the metal layer is exemplarily copper. The circuit board 83 can be directly a bulk of circuit board, and alternatively, the circuit board 83 also can be formed as shown in FIG. 10, namely, two copper clad boards 81 with at least one half-cured sheet 82 disposed there between are laminated to form the circuit board 83. In this embodiment, the copper clad board 81 is exemplarily a single-sided copper clad board. Then, as shown in FIG. 11, a plurality of through holes 84 are formed on the circuit board 83, such as, through drilling. In this embodiment, the arrangement of the through holes 84 are in rows and columns, but not limited thereto. As shown in FIG. 12, a first plating layer 85 is formed on the upper surface, the lower surface and the through holes 84, wherein the material of the first plating layer 5 includes copper. The upper surface and the second surface are electrically connected through the first plating layer 85 within the through holes 84. In this embodiment, the circuit board 83 is dipped in an electroplating bath (not shown) for copper plating, and the thickness of the plating layer 85 within the through holes 84 can be adjusted according to practical requirements. As shown in FIG. 13, a pattern layer 86 is formed respectively on the upper surface and on the lower surface of the circuit board 83, and the pattern layer 86 on the upper surface of the circuit board 83 is connected to the pattern layer 86 on the lower surface of the circuit board 83 through the plurality of through holes 84. In this embodiment, the method for forming the pattern layer 86 includes exposure, development and etching. As shown in FIG. 14, a plurality of pads 87 are formed on the circuit board 83, and a second plating layer 89 is formed on the upper surface and the lower surface of the circuit board 83. Here, the positions of the plurality of pads 87 are corresponding to the pattern layer 86, and in order to clearly show the pads 87, the pattern layer 86 is omitted in FIG. 14. However, it is clear that the pads 87 are located at the positions corresponding to the pattern layer 86. In this embodiment, the method for forming the pads 87 includes printing, exposure and development, and the material of the second plating layer 89 includes nickel. In an embodiment, a third plating layer is further included and the material of the third plating layer exemplarily includes gold. Then, please refer to FIG. 15, FIG. 16A and FIG. 16B. The third capacitors 53 are disposed on the upper surface and the lower surface of the circuit board 83 at positions corresponding to the pads 87, as shown in FIG. 16B. In this embodiment, the method for disposing the third capacitors 53 includes the surface mount technology. As shown in FIG. 17A and FIG. 17B, the circuit board 83 is cut in accordance with the positions of the plurality of through holes 84 to form at least one connection board 60 for being used as at least one of the conductive portions 6, and the plating surface within the through holes 84 is at least partially exposed at one end of the connection board 60.

In conclusion, the present disclosure provides a vertical power supply system, in which the plurality of first capacitors are disposed on the second surface of the system board, the plurality of second capacitors are disposed on the third surface of the substrate, and/or the plurality of third capacitors are disposed on the side walls of the conductive portions, that is, the capacitors in the vertical power supply system according to the present disclosure are not embedded in the substrate but disposed on the surface of the substrate, and further, more capacitors are disposed on the surface of the system board and/or the side walls of the conductive portions. Accordingly, the first capacitors and the second capacitors in the vertical power supply system of the present disclosure which are not embedded in the substrate can be selected to employ a material from a wider range and with a lower cost. Furthermore, because the first capacitors and the second capacitors are respectively disposed on the surfaces of the system board and the substrate, the arrangement of the capacitors in the vertical power supply system of the present disclosure can be developed in a three-dimensional manner to effectively increase the quantity of capacitors, thereby achieving the effect of improving the total capacitance of output capacitors and providing a stable working voltage to the chip unit.

What is claimed is:

1. A vertical power supply system, comprising:
   a system board comprising a first surface and a second surface, wherein the first surface and the second surface are opposite to each other;
   a substrate comprising a third surface and a fourth surface, wherein the third surface and the fourth surface are opposite to each other, and the third surface of the substrate is located between the fourth surface and the second surface of the system board;
   a chip unit disposed on the first surface;
   a plurality of first capacitors disposed on the second surface, wherein two electrodes of any of the plurality of first capacitors are disposed on the second surface;

a plurality of second capacitors disposed on the third surface, wherein two electrodes of any of the plurality of second capacitors are disposed on the third surface;

a plurality of conductive portions, wherein the third surface and the second surface are electrically connected through the plurality of conductive portions; and a power unit disposed on the fourth surface.

2. The vertical power supply system as claimed in claim 1, wherein at least one of the plurality of first capacitors is disposed between two adjacent conductive portions of the plurality of conductive portions.

3. The vertical power supply system as claimed in claim 1, wherein at least one of the plurality of second capacitors is disposed between two adjacent conductive portions of the plurality of conductive portions.

4. The vertical power supply system as claimed in claim 1, wherein a projection of at least one of the plurality of first capacitors on the second surface of the system board and a projection of at least one of the plurality of second capacitors on the second surface of the system board are overlapped.

5. The vertical power supply system as claimed in claim 1, wherein the substrate comprises a plurality of first pins and a plurality of second pins, the plurality of first pins are disposed on the third surface, the plurality of second pins are disposed on the fourth surface, and the plurality of first pins and the plurality of second pins are electrically connected, and wherein each of the plurality of conductive portions are disposed on a corresponding first pin of the plurality of first pins, and one of the plurality of second pins corresponding to the corresponding first pin is electrically connected to an output terminal of the power unit.

6. The vertical power supply system as claimed in claim 5, wherein each of the plurality of first pins is electrically connected to a corresponding second pin of the plurality of second pins through a first conductive structure.

7. The vertical power supply system as claimed in claim 6, wherein the first conductive structure comprises a via or a blind hole.

8. The vertical power supply system as claimed in claim 5, wherein each of the plurality of second capacitors is electrically connected to a corresponding first pin of the plurality of first pins.

9. The vertical power supply system as claimed in claim 5, wherein the substrate comprises at least one trench concavely formed from the third surface for accommodating at least one of the plurality of second capacitors.

10. The vertical power supply system as claimed in claim 9, wherein each of the plurality of first pins is electrically connected to a corresponding second pin of the plurality of second pins through a first conductive structure, and each of the plurality of second capacitors is electrically connected to the first conductive structure through a connecting lead.

11. The vertical power supply system as claimed in claim 9, wherein each of the plurality of first pins is electrically connected to a corresponding second pin of the plurality of second pins through a first conductive structure, and each of the plurality of second capacitors is electrically connected to the first conductive structure through a connecting lead and a second conductive structure, and wherein the second conductive structure is connected to the second capacitor, and the connecting lead is connected to the first conductive structure.

12. The vertical power supply system as claimed in claim 1, wherein the conductive portions comprise conductive columns or solder balls.

13. The vertical power supply system as claimed in claim 1, wherein the conductive portions comprise connection boards, and each of the connection boards comprises a first end, a second end and a side wall, and wherein the first end and the second end are opposite to each other, the first end is electrically connected to the second surface of the system board, the second end is electrically connected to the third surface of the substrate, the side wall is disposed between the first end and the second end in a surrounding manner, and the side wall has at least one third capacitor disposed thereon.

* * * * *